US012126136B2

United States Patent
Ou et al.

(10) Patent No.: US 12,126,136 B2
(45) Date of Patent: Oct. 22, 2024

(54) VERTICAL CAVITY SURFACE EMITTING LASER DEVICE AND MANUFACTURING METHOD THEREOF

(71) Applicant: ABOCOM SYSTEMS, INC., Miaoli County (TW)

(72) Inventors: Cheng-Yi Ou, Miaoli County (TW); Chih-Yuan Lin, Miaoli County (TW); Te-Lieh Pan, Miaoli County (TW); Cheng-Hsiao Chi, Miaoli County (TW)

(73) Assignee: ABOCOM SYSTEMS, INC., Miaoli County (TW)

(*) Notice: Subject to any disclaimer, the term of this patent is extended or adjusted under 35 U.S.C. 154(b) by 525 days.

(21) Appl. No.: 17/558,614

(22) Filed: Dec. 22, 2021

(65) Prior Publication Data

US 2022/0224080 A1    Jul. 14, 2022

(30) Foreign Application Priority Data

Jan. 8, 2021   (TW) ................. 110100815

(51) Int. Cl.
*H01S 5/183*   (2006.01)
*H01S 5/34*    (2006.01)
*H01S 5/343*   (2006.01)

(52) U.S. Cl.
CPC ...... *H01S 5/18361* (2013.01); *H01S 5/18311* (2013.01); *H01S 5/3416* (2013.01); *H01S 5/343* (2013.01)

(58) Field of Classification Search
CPC ............. H01S 5/18361; H01S 5/18311; H01S 5/3416; H01S 5/343; H01S 5/3054; H01S 5/3095
See application file for complete search history.

(56) References Cited

U.S. PATENT DOCUMENTS

| | | | | |
|---|---|---|---|---|
| 6,185,241 B1* | 2/2001 | Sun | ...................... | H01S 5/04253 372/96 |
| 2006/0285566 A1* | 12/2006 | Ueki | .................... | H01S 5/18341 372/45.01 |
| 2015/0311673 A1* | 10/2015 | Wang | .................. | H01S 5/18305 372/27 |
| 2015/0364320 A1* | 12/2015 | Riaziat | ............. | H01L 21/67017 118/724 |
| 2017/0256915 A1* | 9/2017 | Ghosh | .................... | H01S 5/1833 |
| 2021/0367407 A1* | 11/2021 | Yang | .................... | H01S 5/18358 |

* cited by examiner

*Primary Examiner* — Xinning(Tom) Niu
(74) *Attorney, Agent, or Firm* — Fei-Hung Yang

(57) ABSTRACT

A vertical cavity surface emitting laser (VCSEL) device includes a substrate, a first mirror layer, a tunnel junction layer, a second mirror layer, an active layer, an oxide layer and a third mirror layer sequentially stacked with one another. The first mirror layer and the third mirror layer are N-type distributed Bragg reflectors (N-DBR), and the second mirror layer is P-type distributed Bragg reflector (P-DBR). The tunnel junction layer is provided for the VCSEL device to convert a part of the P-DBR into N-DBR to reduce the series resistance of the VCSEL device, and the tunnel junction layer is not used as current-limiting apertures. This disclosure further discloses a VCSEL device manufacturing method with the in-situ and one-time epitaxy features to avoid the risk of process variation caused by moving the device into and out from an epitaxial cavity.

10 Claims, 5 Drawing Sheets

VERTICAL CAVITY SURFACE EMITTING LASER DEVICE AND MANUFACTURING METHOD THEREOF

CROSS-REFERENCE TO RELATED APPLICATIONS

This non-provisional application claims priority under 35 U.S.C. § 119(a) on Patent Application No(s). 110100815 filed in Taiwan, R.O.C. on Jan. 8, 2021, the entire contents of which are hereby incorporated by reference.

BACKGROUND

Technical Field

The present disclosure relates to a vertical cavity surface emitting laser (VCSEL) device and its manufacturing method, and more particularly to the VCSEL device and its manufacturing method using a P-type distributed Bragg reflector (DBR) with less stacked layers to achieve low series resistance.

Description of Related Art

Semiconductor light emitting device can be divided into Light-Emitting Diode (LED) device and Laser Diode (LD) device. The LED device is a divergent light source with weak luminous energy and too-large beam angle, so that its functionality is insufficient and can only be applied for general lighting or used in 2D sensing systems. On the other hand, the laser beam generated by the LD device has large beam angle and better shape than those of the LED device and the advantages of low power consumption, high efficiency and high speed, so that the LD device is applicable for the fields of 3D sensing and optical communication. As to the structural aspect, the structure of the LD device is more complicated, the material requirement is higher, and the design is more difficult, and the epitaxy technology with a high level of difficulty is required for the mass production of the LD device. Although both the LD device and the LED device are light emitting devices, their uses, effects, structures and technical fields are different.

As the name suggests, the vertical cavity surface emitting laser (VCSEL) device emits a laser beam vertically from the surface of a grain surface, and the LD device is one of the VCSEL devices. For example, Gallium Arsenide (GaAs) is used as a substrate of the VCSEL device, a first mirror layer is formed at the top of the substrate, an active layer is formed at the top of the first mirror layer, an oxide layer is formed at the top of the active layer, and a second mirror layer is formed at the top of the oxide layer. As an example, wet oxidation is used to manufacture the VCSEL device, the substrate is an N-type (n+GaAs or N–GaAs) substrate, the first mirror layer is an N-type distributed Bragg reflector (N-DBR), and the second mirror layer is a P-type distributed Bragg reflector P-DBR). The VCSEL device uses the second mirror layer and the first mirror layer disposed at the top and bottom of the active layer respectively as reflective mirror surfaces to generate a laser beam emitted from a resonant cavity.

For example, the N-DBR is generally formed by repeatedly stacking a stacked pair composed of a lower layer $Al_{0.12}Ga_{0.88}As$ and an upper layer $Al_{0.9}Ga_{0.1}As$, and the N-DBR can be obtained by doping silicon with an undoped DBR, and the N-DBR has approximately 35 silicon-doped stacked pairs. The P-DBR is also formed by repeatedly stacking a stacked pair composed of a lower layer $Al_{0.12}Ga_{0.88}As$ and an upper layer $A_{l0.9}Ga_{0.1}As$, and the P-DBR can be obtained by doping carbon with an undoped DBR, and the P-DBR has approximately 25 carbon-doped stacked pairs. The N-DBR and the P-DBR adopt a total of approximately 60 stacked pairs (or approximately 120 layers) to achieve high reflectivity of approximately 99.9% for the N-DBR and approximately 99.0% for the P-DBR. However, the large quantity of layers (up to 120 layers) also leads to high series resistance.

In one of the methods, the high series resistance is overcome by performing a high-concentration silicon and carbon doping for the N-DBR and the P-DBR respectively, but actually the carbon doping concentration of P-DBR (which is a P-type semiconductor) has an upper limit of approximately $0.30 \times 10^{19} \sim 1.0 \times 10^{19}$ atoms/cm$^3$, so that the resistance value of the P-DBR cannot be lower than the required resistance value. Even though the carbon doping concentration of the P-DBR can be $1.0 \times 10^{19}$ atoms/cm$^3$ or above, it will be difficult to control the reproducibility and uniformity of the P-DBR with the same thickness during the epitaxial process, and the traditional VCSEL device has an issue of unable to overcome the high series resistance of the P-DBR effectively.

SUMMARY

Therefore, it is a primary objective of the present disclosure to overcome the problems of the prior art by providing a VCSEL device and its manufacturing method in accordance with the present disclosure.

To achieve the foregoing and other objectives, the present disclosure discloses a VCSEL device and its manufacturing method based on the N-DBR can achieve a doping concentration higher than that of the P-DBR to effectively reduce the series resistance, and the effective mass of electron is smaller than that of the electron hole, and the resistance of the N-DBR will not be affected by the oxide apertures disposed at the center of the oxide layer, so that the resistance of the P-DBR is much greater than that of the N-DBR. In this way, a majority of the series resistance of the VCSEL device comes from the P-DBR, so that the present disclosure can reduce the series resistance of the VCSEL device by converting a part of the P-DBR into N-DBR.

The present disclosure discloses a VCSEL device and its manufacturing method, and the VCSEL device includes: a substrate; a first mirror layer which is a first N-type distributed Bragg reflector layer disposed at the top of the substrate; a tunnel junction layer disposed at the top of the first mirror layer; a second mirror layer which is a P-type distributed Bragg reflector layer disposed at the top of the tunnel junction layer, and the first mirror layer and the second mirror layer include a plurality of stacked pairs respectively, and stacked pair includes a first layer and a second layer; the tunnel junction layer includes a heavily doped N-type layer and a heavily doped P-type layer, wherein an N-type filling layer is disposed between the heavily doped N-type layer and the first mirror layer, and a P-type filling layer is disposed between the heavily doped P-type layer and the second mirror layer; an active layer, disposed at the top of the second mirror layer; and an oxide layer, disposed at the top of the active layer; and a third mirror layer, disposed at the top of the oxide layer, and the third mirror layer is a second N-type distributed Bragg reflector layer.

In another embodiment, the tunnel junction layer has an area equal to the area of the first mirror layer and/or the area of the second mirror layer.

In another embodiment, the oxide layer includes an oxide aperture disposed at a central area of the oxide layer and an oxide area disposed around the oxide aperture, and the oxide aperture has an area smaller than the area of the tunnel junction layer.

In another embodiment, the tunnel junction layer has an area equal to the area of the first mirror layer and/or the area of the second mirror layer; and the oxide layer includes an oxide aperture disposed at a central area of the oxide layer and an oxide area disposed around the oxide aperture, and the oxide aperture has an area smaller than the area of the tunnel junction layer.

In another embodiment, the sum of the thickness of the heavily doped N-type layer and the thickness of the N-type filling layer is equal to the thickness of the first layer, and the sum of the thickness of the heavily doped P-type layer and the thickness of the P-type filling layer is equal to the thickness of the second layer; or the sum of the thickness of the N-type filling layer, the thickness of the heavily doped N-type layer, the thickness of the heavily doped P-type layer and the thickness of the P-type filling layer is equal to the thickness of the first layer, or the thickness of the second layer.

The present disclosure further provides a VCSEL device manufacturing method using an in-situ one-time epitaxy to avoid the risk of process variation, and the VCSEL device manufacturing method of this disclosure includes the following epitaxy steps: In a step of providing a substrate, the substrate is provided in a cavity. In the step of forming a first mirror layer: The first mirror layer is formed in-situ at the cavity on the substrate, and the first mirror layer is a first N-type distributed Bragg reflector layer. In the step of forming a tunnel junction layer, the tunnel junction layer is formed in-situ at the cavity on the first mirror layer. In the step of forming a second mirror layer, the second mirror layer is formed in-situ at the cavity on the tunnel junction layer, and the second mirror layer is a P-type distributed Bragg reflector layer. In the step of forming an oxide layer and a third mirror layer, an active layer, the oxide layer and the third mirror layer are formed on the second mirror layer, and the step of forming the oxide layer and the third mirror layer is carried out in-situ at the cavity.

In another embodiment, the tunnel junction layer has an area equal to the area of the first mirror layer and/or the area of the second mirror layer; and the oxide layer includes an oxide aperture at a central area of the oxide layer and an oxide area around the oxide aperture, and the oxide aperture has an area smaller than the area of the tunnel junction layer.

In another embodiment, the first mirror layer and the second mirror layer include a plurality of stacked pairs, and each stacked pair includes a first layer and a second layer; the tunnel junction layer includes a heavily doped N-type layer and a heavily doped P-type layer, and an N-type filling layer is disposed between the heavily doped N-type layer and the first mirror layer, and a P-type filling layer is disposed between the heavily doped P-type layer and the second mirror layer; and the sum of the thickness of the heavily doped N-type layer and the thickness of the N-type filling layer is equal to the thickness of the first layer, and the sum of the thickness of the heavily doped P-type layer and the thickness of the P-type filling layer is equal to the thickness of the second layer; or the sum of the thickness of the N-type filling layer and the thickness of the heavily doped N-type layer, the thickness of the heavily doped P-type layer and the thickness of the P-type filling layer is equal to the thickness of the first layer or the thickness of the second layer.

DESCRIPTION OF THE EMBODIMENTS

This disclosure will now be described in more detail with reference to the accompanying drawings that show various embodiments of the invention.

Figure 1:
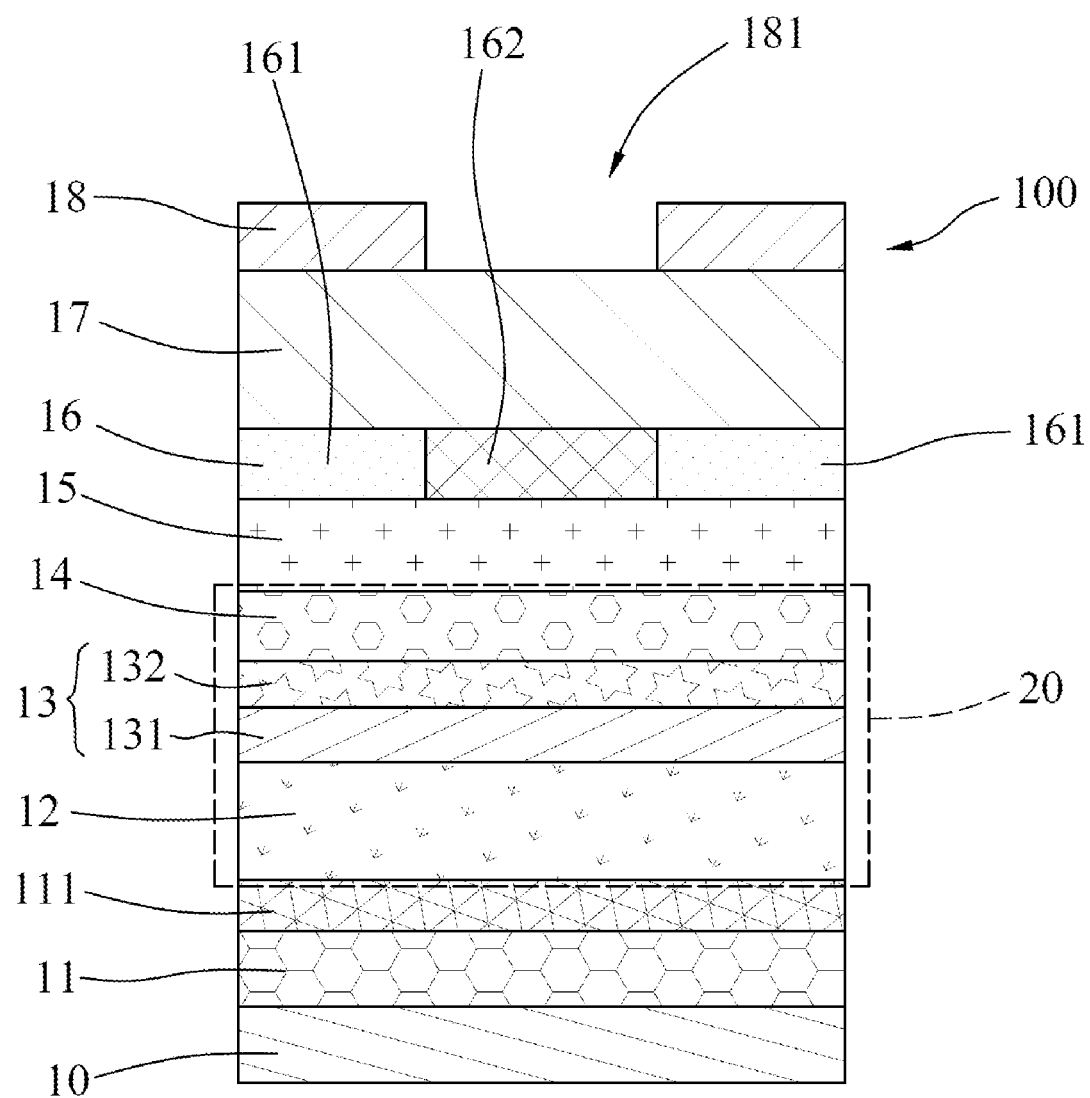
FIG. 1 is a cross-sectional view showing the structure of a VCSEL device in accordance with this disclosure.

With reference to FIG. 1 for a VCSEL device of the present disclosure, the VCSEL device 100 includes: a first electrode 10; a substrate 11, which can be contacted with the first electrode 10 and disposed at the top or bottom of the substrate 11; a first mirror layer 12, which is disposed at the top of the substrate 11, and can be a first N-type distributed Bragg reflector (first N-DBR) and contacted with an upper surface of the substrate 11; a tunnel junction (TJ) layer 13, which is disposed at the top of the first mirror layer 12 and can be contacted with an upper surface of the first mirror layer 12; a second mirror layer 14, which is disposed at the top of the tunnel junction layer 13, and can be a P-type distributed Bragg reflector (P-DBR), and contacted with an upper surface of the tunnel junction layer 13; an active layer 15, which is disposed at the top of the second mirror layer 14, and can be contacted with an upper layer of the second mirror layer 1; an oxide layer 16, disposed at the top of the active layer 15; a third mirror layer 17, disposed at the top of the oxide layer 16, and can be a second N-type distributed Bragg reflector (second N-DBR); and a second electrode 18, which is disposed at the top of the third mirror layer 17 and can be contacted with the third mirror layer 17. In other words, the VCSEL device 100 includes the substrate 11, the first mirror layer 12, the tunnel junction layer 13, the second mirror layer 14, the active layer 15, the oxide layer 16 and the third mirror layer 17 sequentially arranged from bottom to top.

The first electrode 10 and the second electrode 18 can be made of gold, silver, copper, iron, cobalt, nickel, titanium or their analogues or alloys, wherein the alloy can be zinc alloy or germanium alloy, and the first electrode 10 and the second electrode 18 can be made of the same material or different materials. Basically, the first electrode 10 and the second electrode 18 can be both N-type (ohmic) electrodes or can be both P-type (ohmic) electrodes. For example, the first electrode 10 is an N-type electrode and the second electrode 18 is also N-type electrode. The second electrode 18 is in a ring shape, with its central area acting as a light exit aperture 181, and the VCSEL device 100 can emit a laser beam through the light exit aperture 181.

The substrate 11 can be made of a common monocrystalline semiconductor material such as the gallium arsenide (GaAs), gallium nitride (GaN), aluminium gallium arsenide (AlGaAs) or gallium phosphide (GaP) substrate. Preferably, the substrate 11 is a GaAs substrate. The substrate 11 includes a buffer layer 111 made of the same material, and the buffer layer 111 is an N-type semiconductor layer and can be a part of the substrate 11. The substrate 11 must have a smooth crystal surface provided for the subsequent epitaxy growth process of forming the first mirror layer 12 on the upper surface of the buffer layer 111. In other words, the first mirror layer 12 is grown on the upper surface of the substrate 11.

Each of the first mirror layer 12, second mirror layer 14 and third mirror layer 17 is a multilayer structure, in which each adjacent layer is made of alternately stacked semiconductor materials with different refractive indexes. The first mirror layer 12 (or first N-DBR) is an N-type semiconductor layer such as a doped silicon (Si) and/or tellurium (Te) AlGaAs layer. The second mirror layer 14 (P-DBR) is a P-type semiconductor layer such as a doped carbon (C) and/or zinc (Zn) AlGaAs layer. Each of the first mirror layer 12 and the second mirror layer 14 is an AlGaAs multilayer structure with different aluminium mole percentages to change the refractive index. The third mirror layer 17 (or second N-DBR) is also an N-type semiconductor layer such as a doped silicon (Si) and/or tellurium (Te) AlGaAs layer. The first mirror layer 12 and the third mirror layer 17 can be the same N-type semiconductor layer or different N-type semiconductor layers. Each of the first mirror layer 12 and the third mirror layer 17 has a reflectivity greater than 99.9%, and the overall reflectivity of the combined first mirror layer 12, tunnel junction layer 13 and second mirror layer 14 is also greater than 99.9%.

The tunnel junction layer 13 can be a multilayer structure including a heavily doped N-type layer 131 and a heavily doped P-type layer 132. In the tunnel junction layer 13, the heavily doped P-type layer 132 is disposed adjacent to the second mirror layer 14, and the heavily doped N-type layer 131 is disposed adjacent to the first mirror layer 12. The tunnel junction layer 13 is made of a material such as GaAs, AlGaAs, InGaP, AlInP, AlGaInP or InGaAsP. For example, the heavily doped N-type layer 131 is a doped silicon (Si) and/or tellurium (Te) AlGaAs layer or a Group III phosphide semiconductor layer such as an indium gallium phosphide (InGaP) layer; and the heavily doped P-type layer 132 is a doped carbon (C) AlGaAs layer or a Group III phosphide semiconductor layer (such as an InGaP layer).

The active layer 15 can include one or more quantum well layers with spectral gap wavelength, and each quantum well layer emits laser beams under an operating wavelength. For example, the active layer 15 can include an AlGaAs layer, a GaAs layer, a gallium arsenic phosphide (GaAsP) layer or an indium gallium arsenide (InGaAs) layer. The active layer 15 can also include quantum holes or other device structures with an appropriate light emitting property such as quantum dots or similar device structures. The quantum well layers, quantum holes or quantum dots are disposed in the active layer 15 and separated to generate the required laser beams.

The oxide layer 16 can be an optically and electrically limited oxide layer formed by oxidizing one or more epitaxial layers. For example, the oxide layer 16 can be an oxide area 161 of aluminium oxide ($Al_2O_3$) formed by a lateral oxidation of the epitaxial layer (such as an AlGaAs layer) and an oxide aperture 162 including a metal (such as unoxidized aluminium) and disposed at a central area. Therefore, the oxide area 161 is an insulated area disposed around the conductive oxide aperture 162, and the oxide aperture 162 is passed through the oxide area 161 to form a conductive path with a limited area, and electricity and light (laser beam) are passed from the oxide aperture 162, and the oxide aperture 162 is a current-limiting aperture. The smaller the oxide aperture 162, the larger the resistance value. The oxide aperture 162 can be formed at the bottom of the light exit aperture 181, and the oxide aperture 162 is slightly smaller than the light exit aperture 181.

It is noteworthy that the tunnel junction layer 13 is disposed between the first mirror layer 12 and the second mirror layer 14, so that the first N-DBR of the first mirror layer 12, the tunnel junction layer 13, and the P-DBR of the second mirror layer 14 can be formed with the same or substantially similar valence band, and the combination of the first mirror layer 12, the tunnel junction layer 13 and the second mirror layer 14 can be formed into a P-type distributed Bragg reflector structure 20. In other words, the tunnel junction layer 13 is allowed to switch from the N-type semiconductor layer to the P-type semiconductor layer. For example, the tunnel junction layer 13 is switched from the first N-DBR of the first mirror layer 12 to the P-DBR of the second mirror layer 14. Therefore, the dimensions (including area and shape) of the tunnel junction layer 13 can be the same as those of the first mirror layer 12 and/or the second mirror layer 14.

In addition, the tunnel junction layer 13 can be formed at the bottom of the oxide aperture 162, and the oxide aperture 162 has an area smaller than the area of the tunnel junction layer 13, so that the VCSEL device 100 of the present disclosure uses the oxide aperture 162 with a smaller area as an electrically and optically limited channel, and the tunnel junction layer 13 with a larger area is not used as the electrically and optically limited channel. In other words, the tunnel junction layer 13 is not used for the effect of the current-limiting aperture. Further, the VCSEL device 100 of the present disclosure has the oxide aperture 162 and the tunnel junction layer 13 at the same time, and the effects and purposes of the oxide aperture 162 and the tunnel junction layer 13 are different. The oxide aperture 162 is a current-limiting aperture and the tunnel junction layer 13 is used to switch the first N-DBR of the first mirror layer 12 to the P-DBR of the second mirror layer 14.

Figure 2:
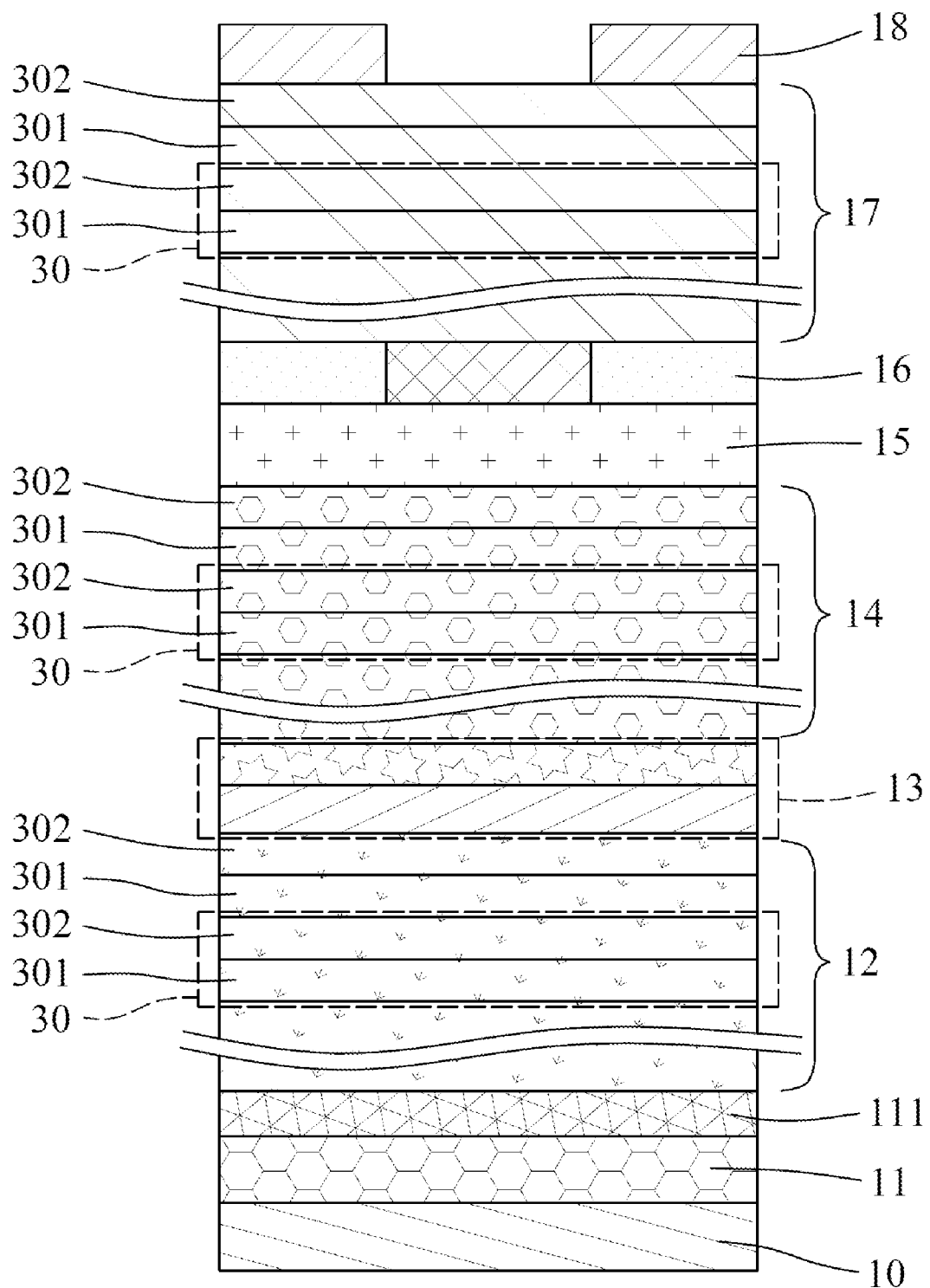
FIG. 2 is a cross-sectional view showing the structure of a VCSEL device having a stacked pair in accordance with this disclosure.

As described above, each of the first mirror layer 12, the second mirror layer 14 and the third mirror layer 17 is a multilayer structure with each adjacent layer made of alternately stacked semiconductor materials of different refractive indexes. In FIG. 2, each of the first mirror layer 12, the second mirror layer 14 and the third mirror layer 17 includes a plurality of stacked pairs 30. Each stacked pair 30 includes a first layer 301 and a second layer 302. The first layer 301 and the second layer 302 of the stacked pair 30 are formed by different materials of different concentrations, and the first layer 301 includes aluminium gallium arsenide ($Al_{0.12}Ga_{0.88}As$) having an aluminium concentration of 12% and a refractive index of 3.55; the second layer 302 includes aluminium gallium arsenide ($Al_{0.9}Ga_{0.1}As$) having an aluminium concentration of 90% and a refractive index of 2.93. In the calculation of thickness, each adjacent layer (including the first layer 301 and the second layer 302) has a thickness approximately equal to a quarter of the wavelength multiplied by the refractive index of each layer. The aforementioned wavelength refers to the wavelength (such as 850 nm) of the laser beam emitted by the VCSEL device. In an embodiment, the first mirror layer 12 has W stacked pairs 30, and the second mirror layer 14 has Z stacked pairs 30, and the sum of W and Z is approximately equal to 35, and Z is preferably an integer between 1 and 10 such as Z=1, 3, 5 or 10. Please refer to Table 1 below.

TABLE 1

| DBR Type | Constituent of Stacked Pair | Material | X value | Thickness (nm) | Dopant | Dopant Content (atoms/cm$^3$) | No. of Stacked Pairs |
|---|---|---|---|---|---|---|---|
| Second mirror layer (P-DBR) | Second layer | AlxGa1-xAs | 0.9 | 72 | C | $3.0 \times 10^{18}$ | Z |
|  | First layer | AlxGa1-xAs | 0.12 | 60 | C | $3.0 \times 10^{18}$ |  |
| First mirror layer (First N-DBR) | Second layer | AlxGa1-xAs | 0.9 | 72 | Si | Greater than $3.0 \times 10^{18}$ | W |
|  | First layer | AlxGa1-xAs | 0.12 | 60 | Si | Greater than $3.0 \times 10^{18}$ |  |

Wherein, W+Z=35, and Z is an integer between 1 and 10.

Since the resistance of the P-DBR is much greater than the resistance of the N-DBR, most of the series resistance of the VCSEL device comes from the P-DBR, and the first mirror layer 12 and the third mirror layer 17 of the VCSEL device 100 of the present disclosure are N-DBRs, and only the second mirror layer 14 is a P-DBR. Compared with the traditional VCSEL device that requires 25 stacked pairs of the P-DBR the VCSEL device 100 of the present disclosure only has at most 10 stacked pairs 30 of the P-DBR. Obviously, the VCSEL device 100 of the present disclosure can reduce the series resistance of the VCSEL device.

Based on the description above, the three-layer combination of the first mirror layer 12, the tunnel junction layer 13 and the second mirror layer 14 constitutes the P-type distributed Bragg reflector structure 20, so that the thickness of the heavily doped N-type layer 131 and the thickness of the heavily doped P-type layer 132 can be equal to the thickness of the first layer 301 (such as 60 nm as shown in Table 1) and the thickness of the second layer 302 (such as 72 nm as shown in Table 1) to comply with the design of reflectivity for the each stacked layer of the DBR (the P-type distributed Bragg reflector structure 20). Embodiments of various tunnel junction layers 13 will be described below.

Figure 3:
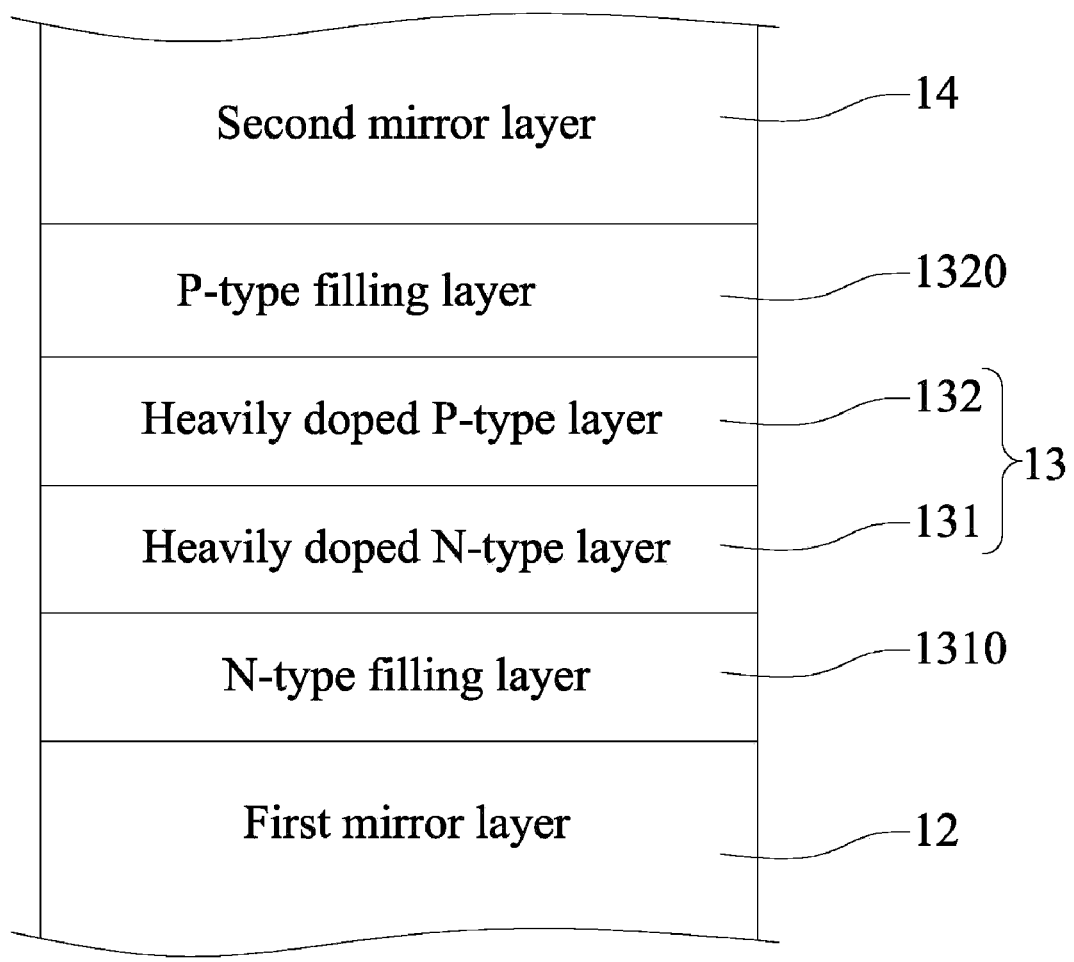
FIG. 3 is a cross-sectional view showing the structure of a tunnel junction layer and a filling layer in accordance with this disclosure.

Basically, in order to achieve the tunnelling function, the thickness of the heavily doped N-type layer 131 of the tunnel junction layer 13 and the thickness of the heavily doped P-type layer 132 of the tunnel junction layer 13 must be at least 10 nm (preferably 10 nm~15 nm), and its doping concentration must be greater than $1.0 \times 10^{20}$ atoms/cm$^3$ (preferably greater than $3.0 \times 10^{20}$ atoms/cm$^3$). Therefore, based on the configuration of the heavily doped N-type layer 131 and the heavily doped P-type layer 132 with a minimum thickness, another embodiment as shown in FIG. 3 is implemented, wherein an N-type filling layer 1310 is disposed between the heavily doped N-type layer 131 and the first mirror layer 12, and a P-type filling layer 1320 is disposed between the heavily doped P-type layer 132 and the second mirror layer 14. The sum of the thickness of the heavily doped N-type layer 131 and the thickness of the N-type filling layer 1310 is equal to the thickness of the first layer 301, and the sum of the thickness of the heavily doped P-type layer 132 and the thickness of the P-type filling layer 1320 is equal to the thickness of the second layer 302, thereby complying with the design of reflectivity of each stacked layer of the DBR (the P-type distributed Bragg reflector structure 20).

In another embodiment, the tunnel junction layer 13, the N-type filling layer 1310 and the P-type filling layer 1320 are AlGaAs layers, and the VCSEL device 100 is sequentially and adjacently stacked with the first mirror layer 12, the N-type filling layer 1310, the heavily doped N-type layer 131, the heavily doped P-type layer 132, the P-type filling layer 1320 and the second mirror layer 14. Please refer to Table 2 below.

TABLE 2

| Type | Constituent | Material | X value | Thickness (nm) | Dopant | Dopant Content (atoms/cm$^3$) | No. of Stacked Pairs |
|---|---|---|---|---|---|---|---|
| Second mirror layer (P-DBR) | Second layer | AlxGa1-xAs | 0.9 | 72 | C | About $3.0 \times 10^{18}$ | Z |
|  | First layer | AlxGa1-xAs | 0.12 | 60 | C |  |  |
| Filling layer | P-type filling layer | AlxGa1-xAs | 0.9 | 57 | C | $3.0 \times 10^{18}$ | — |
| Tunnel junction layer (TJ) | Heavily doped P-type layer | AlxGa1-xAs | 0.9 | 15 | C | Greater than $3.0 \times 10^{20}$ | — |
|  | Heavily doped N-type layer | AlxGa1-xAs | 0.12 | 15 | Te | Greater than $3.0 \times 10^{20}$ | — |
| Filling layer | N-type filling layer | AlxGa1-xAs | 0.12 | 45 | Si | Greater than $3.0 \times 10^{18}$ | — |
| First mirror layer (First N-DBR) | Second layer | AlxGa1-xAs | 0.9 | 72 | Si | Greater than $3.0 \times 10^{18}$ | W |
|  | First layer | AlxGa1-xAs | 0.12 | 60 | Si | Greater than $3.0 \times 10^{18}$ |  |

The sum (60 nm) of the thickness of the heavily doped N-type layer 131 (15 nm) and the thickness of the N-type filling layer 1310 (45 nm) is equal to the thickness of the first layer 301 (60 nm), and the sum (72 nm) of the thickness of the heavily doped P-type layer 132 (15 nm) and the thickness of the P-type filling layer 1320 (57 nm) is equal to the thickness of the second layer 302 (72 nm). Wherein, W+Z=35, and Z is an integer between 1 and 10.

In another embodiment, the tunnel junction layer 13 is a combination of an AlGaAs layer and an InGaP layer, and the N-type filling layer 1310 and the heavily doped N-type layer 131 are InGaP layers (with a refractive index of 3.27), and the heavily doped P-type layer 132 and the P-type filling layer 1320 are AlGaAs layers. Please refer to Table 3 below.

TABLE 3

| Type | Constituent | Material | X value | Thickness (nm) | Dopant | Dopant Content (atoms/cm$^3$) | No. of Stacked Pairs |
|---|---|---|---|---|---|---|---|
| Second mirror layer (P-DBR) | Second layer | Al$_x$Ga$_{1-x}$As | 0.9 | 72 | C | About 3.0 × 10$^{18}$ | Z |
| | First layer | Al$_x$Ga$_{1-x}$As | 0.12 | 60 | C | | |
| Filling layer | P-type filling layer | Al$_x$Ga$_{1-x}$As | 0.9 | 57 | C | 3.0 × 10$^{18}$ | — |
| Tunnel junction layer (TJ) | Heavily doped P-type layer | Al$_x$Ga$_{1-x}$As | 0.9 | 15 | C | Greater than 3.0 × 10$^{20}$ | — |
| | Heavily doped N-type layer | In$_x$Ga$_{1-x}$P | 0.5 | 15 | Te | Greater than 3.0 × 10$^{20}$ | — |
| Filling layer | N-type filling layer | In$_x$Ga$_{1-x}$P | 0.5 | 45 | Si | Greater than 3.0 × 10$^{18}$ | — |
| First mirror layer (first N-DBR) | Second layer | Al$_x$Ga$_{1-x}$As | 0.9 | 72 | Si | Greater than 3.0 × 10$^{18}$ | W |
| | First layer | Al$_x$Ga$_{1-x}$As | 0.12 | 60 | Si | Greater than 3.0 × 10$^{18}$ | |

In Table 3, which is similar to Table 2, the sum (60 nm) of the thickness of the heavily doped N-type layer 131 and the thickness (15 nm) and the thickness of the N-type filling layer 1310 (45 nm) is equal to the thickness of the first layer 301 (60 nm), and the sum (72 nm) of the thickness of the heavily doped P-type layer 132 (15 nm) and the thickness of the P-type filling layer 1320 (57 nm) is equal to the thickness of the second layer 302 (72 nm). Wherein, W+Z=35, and Z is an integer between 1 and 10.

In another embodiment, the tunnel junction layer 13 is a combination of an AlGaAs layer and an InGaP layer, and the N-type filling layer 1310 and the heavily doped N-type layer 131 are AlGaAs layers, and the heavily doped P-type layer 132 and the P-type filling layer 1320 are InGaP layers. Please refer to Table 4 below.

TABLE 4

| Type | Constituent | Material | X value | Thickness (nm) | Dopant | Dopant Content (atoms/cm$^3$) | No. of Stacked Pairs |
|---|---|---|---|---|---|---|---|
| Second mirror layer (P-DBR) | Second layer | Al$_x$Ga$_{1-x}$As | 0.9 | 72 | C | About 3.0 × 10$^{18}$ | Z |
| | First layer | Al$_x$Ga$_{1-x}$As | 0.12 | 60 | C | | |
| Filling layer | P-type filling layer | In$_x$Ga$_{1-x}$P | 0.5 | 57 | C | 3.0 × 10$^{18}$ | — |
| Tunnel junction layer (TJ) | Heavily doped P-type layer | In$_x$Ga$_{1-x}$P | 0.5 | 15 | C | Greater than 3.0 × 10$^{20}$ | — |
| | Heavily doped N-type layer | Al$_x$Ga$_{1-x}$As | 0.12 | 15 | Te | Greater than 3.0 × 10$^{20}$ | — |
| Filling layer | N-type filling layer | Al$_x$Ga$_{1-x}$As | 0.12 | 45 | Si | Greater than 3.0 × 10$^{18}$ | — |
| First mirror layer (first N-DBR) | second layer | Al$_x$Ga$_{1-x}$As | 0.9 | 72 | Si | Greater than 3.0 × 10$^{18}$ | W |
| | first layer | Al$_x$Ga$_{1-x}$As | 0.12 | 60 | Si | Greater than 3.0 × 10$^{18}$ | |

In Table 4, which is similar to Table 2, the sum (60 nm) of the thickness of the heavily doped N-type layer 131 (15 nm) and the thickness of the N-type filling layer 1310 (45 nm) is equal to the thickness of the first layer 301 (60 nm), and the sum (72 nm) of the thickness of the heavily doped P-type layer 132 (15 nm) and the thickness of the P-type filling layer 1320 (57 nm) is equal to the thickness of the second layer 302 (72 nm).

Wherein, W+Z=35, and Z is an integer between 1 and 10.

In another embodiment, the tunnel junction layer 13 is an AlGaAs layer. Unlike the previous embodiments, the sum of the thickness of the N-type filling layer 1310 and the thickness of the heavily doped N-type layer 131, the thickness of the heavily doped P-type layer 132, and the thickness of the P-type filling layer 1320 is equal to the thickness of the first layer 301. Please refer to Table 5 below.

TABLE 5

| Type | Constituent | Material | X value | Thickness (nm) | Dopant | Dopant Content (atoms/cm$^3$) | No. of Stacked Pairs |
|---|---|---|---|---|---|---|---|
| Second mirror layer (P-DBR) | Second layer | Al$_x$Ga$_{1-x}$As | 0.9 | 72 | C | About 3.0 × 10$^{18}$ | Z |
| | First layer | Al$_x$Ga$_{1-x}$As | 0.12 | 60 | C | | |
| | Second layer | Al$_x$Ga$_{1-x}$As | 0.9 | 72 | C | | |
| Filling layer | P-type filling layer | Al$_x$Ga$_{1-x}$As | 0.12 | 15 | C | 3.0 × 10$^{18}$ | — |
| Tunnel junction layer (TJ) | Heavily doped P-type layer | Al$_x$Ga$_{1-x}$As | 0.12 | 15 | C | Greater than 3.0 × 10$^{20}$ | — |
| | Heavily doped re-type layer | Al$_x$Ga$_{1-x}$As | 0.12 | 15 | Te | Greater than 3.0 × 10$^{20}$ | — |
| Filling layer | N-type filling layer | Al$_x$Ga$_{1-x}$As | 0.12 | 15 | Si | Greater than 3.0 × 10$^{18}$ | — |
| First mirror layer (first N-DBR) | Second layer | Al$_x$Ga$_{1-x}$As | 0.9 | 72 | Si | Greater than 3.0 × 10$^{18}$ | W |
| | First layer | Al$_x$Ga$_{1-x}$As | 0.12 | 60 | Si | Greater than 3.0 × 10$^{18}$ | |

In Table 5, the sum (60 nm) of the thickness of the N-type filling layer 1310 (15 nm), the thickness of the heavily doped N-type layer 131 (15 nm), the thickness of the heavily doped P-type layer 132 (15 nm) and the thickness of the P-type filling layer 1320 (15 nm) is equal to the thickness of the first layer 301 (60 nm). Wherein, W+Z=35, and Z is an integer between 1 and 10.

In another embodiment, the tunnel junction layer 13 is an AlGaAs layer. The sum of the thickness of the N-type filling layer 1310, the thickness of the heavily doped N-type layer 131, the thickness of the heavily doped P-type layer 132, and the thickness of the P-type filling layer 1320 is equal to the thickness of the second layer 302. Please refer to Table 6 below.

TABLE 6

| Type | Constituent | Material | X value | Thickness (nm) | Dopant | Dopant Content (atoms/cm$^3$) | No. of Stacked Pairs |
|---|---|---|---|---|---|---|---|
| Second mirror layer (P-DBR) | Second layer | Al$_x$Ga$_{1-x}$As | 0.9 | 72 | C | About 3.0 × 10$^{18}$ | Z |
| | First layer | Al$_x$Ga$_{1-x}$As | 0.12 | 60 | C | | |
| Filling layer | P-type filling layer | Al$_x$Ga$_{1-x}$As | 0.9 | 21 | C | | — |
| Tunnel junction layer (TJ) | Heavily doped P-type layer | Al$_x$Ga$_{1-x}$As | 0.9 | 15 | C | Greater than 3.0 × 10$^{20}$ | — |
| | Heavily doped N-type layer | Al$_x$Ga$_{1-x}$As | 0.9 | 15 | Te | Greater than 3.0 × 10$^{20}$ | — |
| Filling layer | N-type filling layer | Al$_x$Ga$_{1-x}$As | 0.9 | 21 | Si | 3.0 × 10$^{18}$ | — |
| First mirror layer (First N-DBR) | First layer | Al$_x$Ga$_{1-x}$As | 0.12 | 60 | Si | About 3.0 × 10$^{18}$ | — |
| | Second layer | Al$_x$Ga$_{1-x}$As | 0.9 | 72 | Si | Greater than 3.0 × 10$^{18}$ | W |
| | First layer | Al$_x$Ga$_{1-x}$As | 0.12 | 60 | Si | Greater than 3.0 × 10$^{18}$ | |

In Table 6, the sum (72 nm) of the thickness of the N-type filling layer 1310 (21 nm), the thickness of the heavily doped N-type layer 131 (15 nm), the thickness of the heavily doped P-type layer 132 (15 nm) and the thickness of the P-type filling layer 1320 (21 nm) is equal to the thickness of the second layer 302. Wherein, W+Z=35, and Z is an integer between 1 and 10.

It is noteworthy that the configuration of the N-type filling layer 1310 and the P-type filling layer 1320 can make the sum of the thickness of the N-type filling layer 1310, the thickness of the tunnel junction layer 13, and the thickness of the P-type filling layer 1320 to be equal to the thickness of the first layer 301 or the thickness of the second layer 302 to comply with the thickness of each adjacent layer which is equal to a quarter of the emitting wavelength multiplied by the refractive index of each layer. Therefore, the configuration of the N-type filling layer 1310 and the P-type filling layer 1320 can reduce the thickness of the heavily doped N-type layer 131 and the thickness of the heavily doped P-type layer 132. For example, the thickness can be reduced to 15 nm, in order to further overcome the difficulty of controlling the reproducibility and uniformity of a traditional P-type semiconductor in a doping process with high carbon doping concentration due to the thickness of the first layer 301 or the thickness of the second layer 302.

Figure 4:
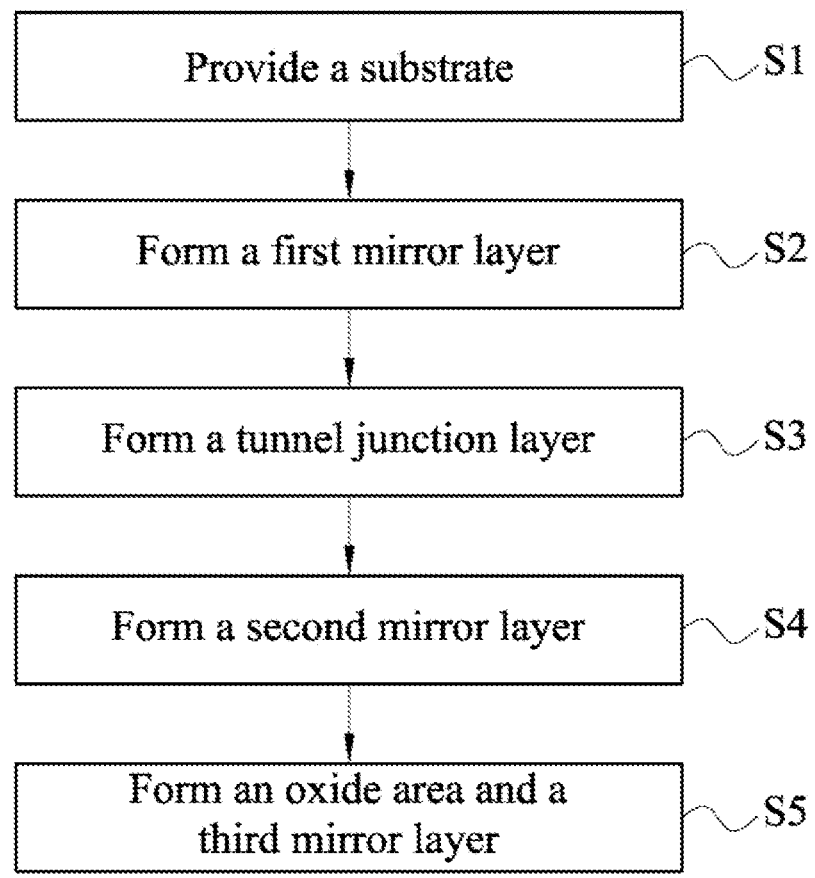
FIG. 4 is a flow chart showing the epitaxy steps of a VCSEL device manufacturing method in accordance with this disclosure.

In FIG. 4, the VCSEL device 100 of the present disclosure is manufactured by a VCSEL device manufacturing method comprising the following epitaxy steps.

S1: Provide a substrate 11 in a cavity, wherein the substrate 11 is a GaAs substrate.

S2: Form a first mirror layer 12 (or first N-DBR) in-situ at the cavity on the substrate 11 by Molecular Beam Epitaxy (MBE) or Metal Organic Chemical Vapor Deposition (MOCVD), wherein the first mirror layer 12 is a doped silicon (Si) and/or tellurium (Te) AlGaAs layer.

S3: Form a tunnel junction layer 13 in-situ at a cavity on the first mirror layer 12 by MBE or MOCVD, wherein both the heavily doped N-type layer 131 and the heavily doped P-type layer 132 of the tunnel junction layer 13 have a thickness equal to 10 nm~15 nm and a doping concentration greater than $1.0 \times 10^{20}$ atoms/cm$^3$.

S4: Form a second mirror layer 14 (P-DBR) in-situ at a cavity on the tunnel junction layer 13 by MBE or MOCVD.

S5: Sequentially form an active layer 15, an oxide layer 16 and a third mirror layer 17 (or second N-DBR) in-situ at a cavity on the second mirror layer 14 by MBE or MOCVD, wherein the oxide layer 16 is manufactured in-situ or ex-situ or manufactured at different cavities by wet oxidation. Preferably the oxide layer 16 is manufactured in-situ by wet oxidation, and the aluminium mole percentage of the oxide layer 16 is $Al_{0.95}Ga_{0.05}As$ or above to facilitate the formation of an insulating oxide area 161 (or aluminium oxide area) during the oxidation process.

It is noteworthy that the epitaxy steps of the VCSEL device manufacturing method including the step S1 of providing a substrate, the step S2 of forming a first mirror layer, the step S3 of forming a tunnel junction layer, and the step S4 of forming a second mirror layer are performed in-situ in the same cavity and completed in a "first-time epitaxy" manner, and even the step S5 of forming an active layer, an oxide layer and a third mirror layer is also performed in-situ in the same cavity and completed in the same "one-time epitaxy" manner as mentioned above. In this way, the tunnel junction layer 13 has dimensions (including area and shape) same as those of the first mirror layer 12 and/or the second mirror layer 14. In other words, if the tunnel junction layer 13 has an area smaller than the area of the first mirror layer 12 or the area of the second mirror layer 14, then it will be necessary to remove the tunnel junction layer 13 from the epitaxial chamber after its formation, and reduce the tunnel junction layer 13 in other chambers by dry or wet etching, and then transfer them back to the epitaxial cavity for a "second-time epitaxy" of the second mirror layer 14. Obviously, moving the tunnel junction layer into and out from the epitaxial cavity twice will cause a risk of process variation, so that the VCSEL device manufacturing method of the present disclosure performs an in-situ one-time epitaxy to avoid the risk of process variation.

Figure 5:
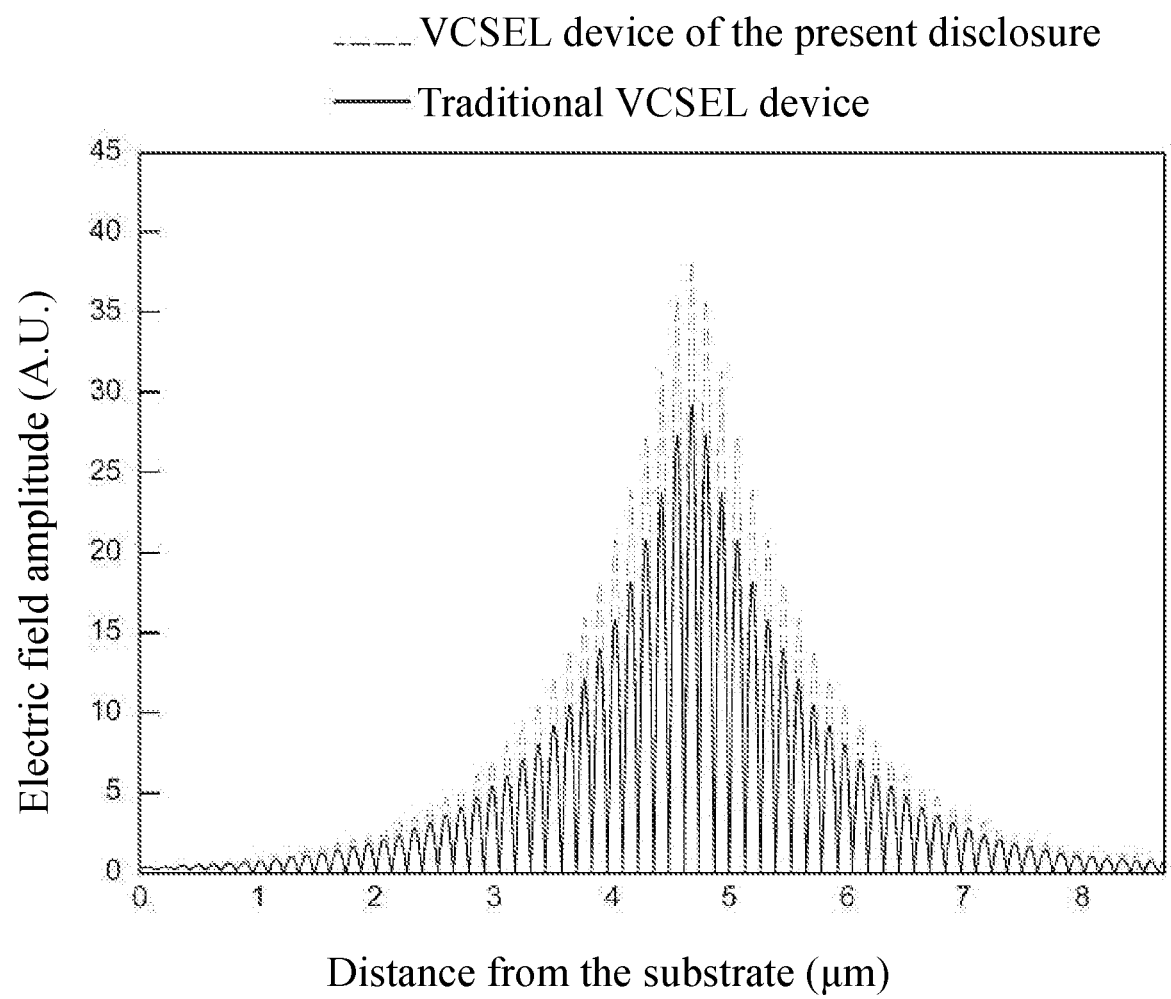
FIG. 5 shows an electric field amplitude versus distance graph to compare a VCSEL device of the present disclosure with a traditional VCSEL device.

In Table 2, the VCSEL device of an embodiment (with Z=10) has an internal electric field intensity distributed in the vertical direction as follows: The structure of a traditional VCSEL device includes a first electrode, a substrate, an N-DBR, an active layer, an oxide layer, a P-DBR and a second electrode sequentially arranged from bottom to top. In an embodiment of the present disclosure, the first electrode, substrate, active layer, oxide layer and second electrode of the VCSEL device 100 have the same composition, structure and thickness of the traditional VCSEL device. The differences between the VCSEL device 100 of the present disclosure and the traditional VCSEL device different are: (1) The VCSEL device 100 of the present disclosure has the tunnel junction layer 13; (2) The third mirror layer 17 (or the second N-DBR) of the VCSEL device 100 of the present disclosure has 25 stacked pairs 30, and the corresponding P-DBR of the traditional VCSEL device also has 25 stacked pairs; (3) The P-type distributed Bragg reflector structure 20 of the VCSEL device 100 of the present disclosure includes the second mirror layer 14 (P-DBR) with 10 (Z=10) stacked pairs 30 and the first mirror layer 12 (first N-DBR) with 25 (W=25) stacked pairs 30, and the first mirror layer 12 and the second mirror layer 14 have a total of 35 stacked pairs 30, and the corresponding N-DBR of the traditional VCSEL device also has 35 stacked pairs. Obviously, the VCSEL device 100 of the present disclosure has the P-DBR 10 with only 10 stacked pairs, which is less than the P-DBR with 25 stacked pairs in the traditional VCSEL device, so that the VCSEL device 100 of the present disclosure can reduce the series resistance of the VCSEL device significantly. In FIG. 5, the series resistance is reduced, so that the VCSEL device 100 of the present disclosure improves the vertical distribution of electric field intensity by 32.7% over the traditional VCSEL device. The vertically distributed electric field intensity can be used with a commercially available VCSEL simulator (such as LASERMOD) to execute numerical analysis.

The present disclosure uses the tunnel junction layer to switch a part of the P-DBR of the VCSEL device to N-DBR in order to reduce the series resistance of the VCSEL device, and the tunnel junction layer is not used for the effect of a current-limiting aperture. In the present disclosure, the configuration of the N-type filling layer and the P-type filling layer can reduce the thickness of the heavily doped N-type layer and the thickness of the heavily doped P-type layer to comply with the design of reflectively of each stacked layer of the DBR. The VCSEL device manufacturing method of the present disclosure adopts an in-situ and one-time epitaxy to avoid the risk of process variation.

What is claimed is:

1. A vertical cavity surface emitting laser (VCSEL) device, comprising:
    a substrate;
    a first mirror layer, being a first N-type distributed Bragg mirror layer disposed at top of the substrate;
    a tunnel junction layer, disposed at top of the first mirror layer;
    a second mirror layer, being a P-type distributed Bragg reflector layer disposed at top of the tunnel junction layer, and the first mirror layer and the second mirror layer comprising a plurality of stacked pairs respectively, and each of the stacked pairs comprising a first layer and a second layer; the tunnel junction layer comprising a heavily doped N-type layer and a heavily doped P-type layer; an N-type filling layer disposed between the heavily doped N-type layer and the first mirror layer, and a P-type filling layer disposed between the heavily doped P-type layer and the second mirror layer;
    an active layer, disposed at top of the second mirror layer;
    an oxide layer, disposed on top of the active layer; and
    a third mirror layer, being a second N-type distributed Bragg reflector layer disposed at top of the oxide layer.

2. The VCSEL device according to claim 1, wherein the tunnel junction layer has an area the same as the area of the first mirror layer and/or the area of the second mirror layer.

3. The VCSEL device according to claim 1, wherein the oxide layer comprises an oxide aperture disposed at a central area thereof and an oxide area disposed circularly around the oxide aperture, and the oxide aperture has an area smaller than the area of the tunnel junction layer.

4. The VCSEL device according to claim 1, wherein the tunnel junction layer has an area the same as the area of the first mirror layer and/or the area of the second mirror layer; the oxide layer comprises an oxide aperture disposed at a central area thereof and an oxide area disposed around the oxide aperture, and the oxide aperture has an area smaller than the area of the tunnel junction layer.

5. The VCSEL device according to claim 1, wherein a sum of a thickness of the heavily doped N-type layer and a thickness of the N-type filling layer is equal to a thickness of the first layer, and a sum of a thickness of the heavily doped P-type layer and a thickness of the P-type filling layer is equal to a thickness of the second layer.

6. The VCSEL device according to claim 1, wherein a sum of a thickness of a N-type filling layer, a thickness of the heavily doped N-type layer, a thickness of the heavily doped P-type layer, and a thickness of the P-type filling layer is equal to a thickness of the first layer or a thickness of the second layer.

7. A vertical cavity surface emitting laser (VCSEL) device manufacturing method, comprising epitaxy steps of:
providing a substrate in a cavity;
forming a first mirror layer in-situ at the cavity on the substrate, wherein the first mirror layer is a first N-type distributed Bragg reflector layer;
forming a tunnel junction layer in-situ at the cavity on the first mirror layer;
forming a second mirror layer in-situ at the cavity on the tunnel junction layer, wherein the second mirror layer is a P-type distributed Bragg reflector layer; and
forming an active layer, an oxide layer and a third mirror layer sequentially on the second mirror layer, and the formation of the oxide layer and the third mirror layer is carried out in-situ at the cavity, wherein
the first mirror layer and the second mirror layer comprise a plurality of stacked pairs, each of the stacked pairs comprising a first layer and a second layer,
the tunnel junction layer comprises a heavily doped N-type layer and a heavily doped P-type layer, and an N-type filling layer is disposed between the heavily doped N-type layer and the first mirror layer, and
a P-type filling layer is disposed between the heavily doped P-type layer and the second mirror layer.

8. The VCSEL device manufacturing method according to claim 7, wherein the tunnel junction layer has an area equal to the area of the first mirror layer and/or the area of the second mirror layer; and the oxide layer comprises an oxide aperture disposed at a central area thereof and an oxide area disposed around the oxide aperture, and the oxide aperture has an area smaller than the area of the tunnel junction layer.

9. The VCSEL device manufacturing method according to claim 8, wherein a sum of a thickness of the heavily doped N-type layer and a thickness of the N-type filling layer equal to a thickness of the first layer, and a sum of a thickness of the heavily doped P-type layer and a thickness of the P-type filling layer is equal to a thickness of the second layer.

10. The VCSEL device manufacturing method according to claim 8, wherein a sum of a thickness of the N-type filling layer, a thickness of the heavily doped N-type layer, a thickness of the heavily doped P-type layer and a thickness of the P-type filling layer is equal to a thickness of the first layer or a thickness of the second layer.

* * * * *